United States Patent
Heid

(10) Patent No.: US 9,235,202 B2
(45) Date of Patent: Jan. 12, 2016

(54) VARIATION OF AN MRI SEQUENCE PARAMETER TO MINIMIZE THE VARIANCE OF A MEASURED VALUE

(75) Inventor: Oliver Heid, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 462 days.

(21) Appl. No.: 13/807,026

(22) PCT Filed: May 19, 2011

(86) PCT No.: PCT/EP2011/058095
§ 371 (c)(1),
(2), (4) Date: Dec. 27, 2012

(87) PCT Pub. No.: WO2012/000716
PCT Pub. Date: Jan. 5, 2012

(65) Prior Publication Data
US 2013/0141099 A1    Jun. 6, 2013

(30) Foreign Application Priority Data
Jun. 30, 2010 (DE) .......................... 10 2010 025 640

(51) Int. Cl.
| | | |
|---|---|---|
| *G05B 15/02* | (2006.01) | |
| *G01R 33/54* | (2006.01) | |
| *G01R 33/28* | (2006.01) | |
| *G01R 33/56* | (2006.01) | |

(52) U.S. Cl.
CPC ................ *G05B 15/02* (2013.01); *G01R 33/28* (2013.01); *G01R 33/543* (2013.01); *G01R 33/5601* (2013.01); *G01R 33/5608* (2013.01)

(58) Field of Classification Search
CPC .. G01R 33/28; G01R 33/543; G01R 33/5601; G01R 33/5608; G05B 15/02
See application file for complete search history.

(56) References Cited

U.S. PATENT DOCUMENTS

| | | | | |
|---|---|---|---|---|
| 5,226,418 A | * | 7/1993 | Bernstein | F28D 9/0037 324/306 |
| 5,281,916 A | * | 1/1994 | Hinks | G01R 33/56308 324/300 |
| 5,544,653 A | | 8/1996 | Takahashi et al. | |
| 6,034,528 A | * | 3/2000 | Heid | G01R 33/561 324/307 |
| 6,310,478 B1 | * | 10/2001 | Heid | G01R 33/5613 324/307 |

(Continued)

OTHER PUBLICATIONS

Yoo et al: "Real-Time Adaptive Functional MRI", Neuroimage, vol. 10, (1999), pp. 596-606.

(Continued)

*Primary Examiner* — Dixomara Vargas
(74) *Attorney, Agent, or Firm* — Schiff Hardin LLP

(57) ABSTRACT

In a magnetic resonance system and a method and device for generating a control command sequence for operating the magnetic resonance system, a magnetic resonance data acquisition sequence is provided to a processor and is modified in the processor. The sequence operates the magnetic resonance system to acquire magnetic resonance data from a subject in multiple individual data acquisitions for subsequent automated evaluation of the individual data acquisitions with respect to an evaluation parameter. The individual evaluation results are combined into an overall evaluation result. The control command sequence is automatically modified in the processor by varying at least one sequence control parameter between different individual data acquisitions so that a variance of a measurement error in the overall evaluation result is minimized.

17 Claims, 3 Drawing Sheets

(56) References Cited

U.S. PATENT DOCUMENTS

| | | | |
|---|---|---|---|
| 6,937,015 B2* | 8/2005 | Heid | G01R 33/54 324/307 |
| 7,020,509 B2* | 3/2006 | Heid | G01R 33/561 324/308 |
| 7,388,376 B2* | 6/2008 | Heid | G01R 33/56545 324/307 |
| 7,906,964 B2* | 3/2011 | Fleysher | G01R 33/54 324/307 |
| 8,077,955 B2* | 12/2011 | Dannels | G01R 33/246 324/309 |
| 8,325,873 B2* | 12/2012 | Helm | A61B 6/02 378/15 |
| 8,502,538 B2* | 8/2013 | Dannels | G01R 33/243 324/307 |
| 2003/0220558 A1 | 11/2003 | Busse | |
| 2004/0242994 A1 | 12/2004 | Brady et al. | |

OTHER PUBLICATIONS

Pandey K.K.: "Mitigation of Motion Artifacts in Functional MRI: A Combined Acquisition, Reconstruction and Post Processing Approach", Dissertation (2009), University of Michigan, USA.

Zhang et al: "Determination of Sample Time for T1 Measurement"; Journal of Magnetic Resonance Imaging, XP55005115, vol. 8, (1998) pp. 675-681.

Xie et al: "Real-Time Adaptive Sequential Design for Optimal Acquisition of Arterial Spin Labeling MRI Data", Magnetic Resonance in Medicine vol. 64, (2010) pp. 203-210.

Bogaert et al: "Ventricular Volumes, Function and Mass", in: "Clinical Cardiac MRI", Springer Verlag, Berlin Heidelberg New York, XP55005119, ISBN: 978-3-54-040170-4, (2005) pp. 103-110.

Van Der Geest et al: "Quantification in Cardiac Magnetic Resonance Imaging and Computed Tomography" In: "MRI and CT of the Cardiovascular System", Lippincott Williams & Wilkins, XP55005120, ISBN: 978-0-78-176271-7, (2006) pp. 91-95.

"Optimized Precision of Inversion-Recovery T1 Measurements for Constrained Scan Time," Ogg et al., Magnetic Resonance in Medicine, vol. 51, pp. 625-630 (2004).

"Optimal Design of Pulsed Arterial Spin Labeling MRI Experiments," Xie et al., Magnetic Resonance in Medicine, vol. 59, pp. 826-834 (2008).

* cited by examiner

VARIATION OF AN MRI SEQUENCE PARAMETER TO MINIMIZE THE VARIANCE OF A MEASURED VALUE

BACKGROUND OF THE INVENTION

1. Field of the Invention

The invention concerns a method and a control sequence determination device to determine a magnetic resonance system control command sequence to acquire raw magnetic resonance data for a magnetic resonance measurement sequence that includes a number of individual measurements in order to evaluate the individual measurements later with regard to an evaluation parameter, and to combine the overall evaluation result that is thereby obtained from the individual measurements into an overall evaluation result of the measurement. The invention furthermore concerns a method to operate a magnetic resonance system using such a control command sequence, as well as a magnetic resonance system with a corresponding control sequence determination device.

2. Description of the Prior Art

In a magnetic resonance system, the body to be examined is typically exposed to a relatively high basic magnetic field (for example of 3 or 7 Tesla) with the use of a basic magnetic field system. A magnetic field gradient is additionally applied with the aid of a gradient system. Excitation signals (RF signals) are then emitted via a radio-frequency transmission system by means of suitable antenna devices, which should lead to the effect that the nuclear spins of specific atoms excited to resonance by this radio-frequency field, are flipped by a defined flip angle relative to the magnetic field lines of the basic magnetic field. This radio-frequency excitation or the resulting flip angle distribution is also designated in the following as a nuclear magnetization, or "magnetization" for short. Upon relaxation of the nuclear spins, radio-frequency signals (magnetic resonance signals) are radiated that are received by suitable reception antennas and are then processed further. Finally, the desired image data can be reconstructed from the raw data acquired in such a manner. The emission of the radio-frequency signals or nuclear magnetic resonance magnetization for the most part takes place by the use of a "whole body coil" or "body coil".

In order to implement a defined magnetic resonance measurement, a control command sequence is typically generated in advance, which control command sequence includes the individual RF pulses to be emitted and gradient pulses to be emitted in coordination for this. This control command sequence is defined (possibly with additional control specifications) in what is known as a measurement protocol which is created in advance and retrieved (from a memory, for example) for a defined measurement and can possibly be modified on site by the operator. During the measurement, the control of the magnetic resonance system then takes place wholly automatically on the basis of this measurement protocol, wherein the control device of the magnetic resonance system reads out and executes the commands from the measurement protocol.

In most cases, magnetic resonance examinations are composed of a sequence of multiple contiguous individual measurements. Typically, multiple parallel, equidistant slices of an examination subject are thus acquired in a multislice measurement in order to optimally acquire the entire volume of a region of interest of the examination subject. For many examinations or diagnostic questions, the individual measurements are—as already mentioned—additionally evaluated later with regard to a specific evaluation parameter, and the evaluation results that are thereby obtained from the individual measurements are combined into an overall evaluation result. A typical example of this is the determination of a volume of a specific organ or part of an organ (for example the volume of a heart chamber). For this the cross section area of the examination subject (for example of the heart chamber) is respectively determined (as an evaluation result of the individual measurements) in the acquired slices, and the cross section area is respectively multiplied by a slice thickness or the slice interval. The volume slices that are obtained with this are then totaled up in order to obtain the total volume as an overall evaluation result. Another example is the creation of an enrichment curve, for which multiple individual measurements are implemented with a defined time interval in order to monitor the enrichment or depletion of a contrast agent in a defined tissue region of interest. Since the overall evaluation result depends on the evaluation results of a plurality of individual measurements which all have unavoidable measurement errors, the overall evaluation result is often plagued with a not inconsiderable uncertainty.

SUMMARY OF THE INVENTION

An object of the present invention is to provide a suitable method as well as a corresponding control sequence determination device to determine magnetic resonance system control command sequences for a magnetic resonance (MR) measurement sequence (data acquisition), which enable the significance of an overall evaluation result (which is formed from the multiple individual measurements (data acquisitions) of the magnetic resonance measurement sequence) to be improved in a simple manner.

In the method according to the invention, the control command sequence is designed so that at least one sequence control parameter is varied between different individual measurements so that the variance of a measurement error is minimized with regard to the overall evaluation result. As used herein, a "design" of a control command sequence means that a series of control commands is generated that precisely set the order and type of radio-frequency pulses (as well as gradient pulses temporally coordinated with these) that are to be emitted, and when magnetic resonance signals are to be read out, in order to excite specifically designated regions of the volume of the examination subject and read out the information that is thereby obtained.

The term "sequence control parameter" means those measurement parameters that typically serve to define or characterize the magnetic resonance measurement sequence as such, meaning those parameters that predetermine the precise sequence of the individual measurements relative to one another and/or their contributions to the overall measurement sequence, for example. Given a multislice measurement, typical examples of these are a slice interval or a slice thickness or a constant, predetermined measurement time interval between successive measurements. Additional typical examples of suitable variable sequence control parameters are provided further in the following. Since the measurement sequence is defined by the sequence control parameter, these can also be called "sequence definition parameters". These do not include measurement parameters that must necessarily change from slice to slice, for example the absolute positions of the slices which—by definition—must be different in at least one coordinate direction. These absolute positions in the definition of a magnetic resonance measurement sequence are to be calculated indirectly by the position of a first slice and the provided sequence control parameters of slice thickness or slice interval.

The basis of the invention is not to predetermine such sequence control parameters as constants for the complete sequence of individual measurements (for example to be processed with a constant slice thickness and/or a constant slice interval or a constant resolution for all individual measurements), as has previously been the case. Instead, the invention is based on the insight that a reduction of the overall measurement error is possible by a suitable variation of these parameters from individual measurement to individual measurement. This improvement of the overall measurement error does not require any more complicated measurements or additional, more expensive hardware than in the previously typical methods. Instead of this, the significance of combined evaluation results of magnetic resonance measurement sequences—for example the volume of a heart chamber that is determined via a multislice measurement—can simply be improved in the manner according to the invention via targeted selection of the magnetic resonance control command sequence within the measurement protocol.

The change of the sequence control parameters from individual measurement to individual measurement so that overall the variance of the measurement error of the desired overall measurement result is reduced—meaning that the measurement error of the overall evaluation result is as small as possible—advantageously takes place according to predetermined rules. The manner by which the variation should be implemented in order to minimize the measurement error depends on various different parameters, in particular on the diagnostic question or the desired overall evaluation result. Particularly suitable variation rules are explained in detail below for specific typical measurements.

According to the invention, a control sequence determination device of the aforementioned type is designed so that it constructs the control command sequence so that at least one sequence control parameter is varied between different individual measurements such that the variance of a measurement error is minimized with regard to the overall evaluation result.

For example, for this the control sequence determination device can have an input interface in order to provide defined input data that are required to construct such a control command sequence, for example information about the examination subject, a target magnetization and/or the specification of which sequence control parameter should be varied. Information about the type of overall evaluation result can thereby also be input so that suitable rules—which rules can be stored in a memory, for example—can be selected based on this in order to implement the matching variation of the sequence control parameter.

The control sequence determination device then automatically determines a suitable magnetic resonance system control command sequence on the basis of all of these input data and can emit these via a control sequence output interface so that the control command sequence can be adopted into a protocol. Naturally, it is also possible for the control sequence determination device to already generate a complete protocol on the basis of additional input data in which the control command sequence is embedded.

The control sequence determination device according to the invention can also be designed so that it adopts a conventionally created, finished control command sequence (for example with constant sequence control parameter) for a magnetic resonance measurement sequence and then modifies this in the manner according to the invention so that one or more specific sequence control parameters are varied between the different individual measurements in order to thus minimize the variance of the measurement error with regard to the overall evaluation result.

Significant portions of the control sequence determination device can be fashioned in the form of software components. For example, the input interface can be a user interface (in particular also a graphical user interface) for manual input of the target magnetization and the additional input data. It can likewise be an interface in order to select and adopt data from a data storage arranged within the control sequence determination device or connected with this via a network, possibly also using the user interface. The control sequence output interface can be, for example, an interface that transmits the control command sequence to a magnetic resonance controller in order to directly control the measurement, but also can be an interface that sends the data via a network and/or stores the data in a memory for later use. These interfaces can likewise be fashioned at least in part in the form of software and possibly also access hardware interfaces of an existing computer.

The invention thus also encompasses a non-transitory, computer-readable data storage medium encoded with programming instructions, which can be loaded directly into a memory of a control sequence determination device. The program code segments execute all steps of the method according to the invention when the program is executed in the control sequence determination device. Such a realization in software has the advantage that even existing devices that are used to determine control command sequences (for example suitable computers in computer centers of the magnetic resonance system manufacturer) can be modified in a suitable manner via implementation of the program in order to determine control command sequences in the manner according to the invention, which control command sequences are linked with a lower radio-frequency exposure.

In a method according to the invention for the operation of a magnetic resonance system, according to the previously described method a control command sequence is determined and then the magnetic resonance system operated using this control command sequence. Correspondingly, a magnetic resonance system of the aforementioned type according to the invention has a previously described control sequence determination device.

As noted above, different sequence control parameters can reasonably be varied depending on the type of magnetic resonance measurement sequence and the type of planned evaluation.

Among these are particular image quality parameters such as a spatial resolution, a matrix size or the number of scanned lines in k-space (in Fourier space) in the individual measurements. For example, given a multislice measurement some slices (which presumably contribute only slightly to the overall evaluation result) are processed with a reduced spatial resolution and/or smaller matrix size and/or a reduced number of scanned k-space lines, in contrast to which the resolution and/or the matrix size and/or the number of scanned lines is increased in other slices whose contribution to the overall evaluation result is most probably significantly greater. In the acquisition of the same data set, errors in the overall evaluation result can thus be reduced.

Additional preferred sequence control parameters that are varied in multislice measurements are spatial position and/or dimension ratio parameters such as the slice thickness and/or the slice interval and/or the slice orientation. Particularly in measurements in which the time response of the volume (for example upon accepting contrast agent) should be evaluated, temporal position and/or dimension relationship parameters (such as the measurement time intervals between the different individual measurements) are meaningful as sequence control parameters to be varied in order to thus obtain a better overall evaluation result.

The rules according to which the variation takes place may depend on a measurement error distribution of the individual measurements, which measurement error distribution is to be evaluated.

In many magnetic resonance measurement sequences, the measurement errors of the evaluation parameter of the individual measurements are equally distributed or, respectively, follow a Gaussian distribution. For example, in such measurements it is advantageous if a variation of the sequence control parameter takes place according to a Gaussian integration rule or, respectively, a Gaussian quadrature. In particular, this is reasonable if a slice interval is to be varied within a multislice measurement. For example, in the sense of the Gaussian integration the slice intervals and the weighting of the individual slice measurements can be optimized or only the slice intervals of the individual measurements are optimized, according to a Gauss-Chebyshev integration, wherein the measurements are weighted identically. In both cases, a reduction of the measurement error of the overall evaluation result in relationship to conventional methods can be achieved in which the slice interval is always kept constant between two successive, parallel slice measurements.

The measurement error distribution of the individual measurements can depend on geometric or temporal boundary conditions. Under the circumstances, an even better reduction of the measurement error by variation of a sequence control parameter can be achieved when the variation or the variation rules are determined on the basis of prior knowledge about an examination subject of the magnetic resonance measurement. In a preferred exemplary embodiment, this prior knowledge about the examination subject can be achieved on the basis of one or more previously implemented imaging measurements. For example, within the scope of most magnetic resonance examinations it can be a previously implemented overview measurement anyway, but there can also be measurements that have already been implemented at greater time intervals beforehand over the examination subject, for example in earlier examinations.

It is also preferable to vary the sequence control parameter depending on at least one geometric parameter of an examination subject of the magnetic resonance measurement, for example depending on how the external shape of the examination subject varies along a defined spatial direction orthogonal to the slice planes of the multislice measurement.

In a preferred exemplary embodiment, the magnetic resonance measurement is a multislice measurement, and the slice interval and/or the slice thickness is thereby varied depending on a cross section area of the examination subject in the appertaining slice. It is preferable to select the slice interval and/or the slice thickness to be increasingly smaller the more significantly that the cross section area of the examination subject changes between adjacent slices, meaning that the variation of the cross section area of the examination subject between adjacent slices is also greater.

Another preferred embodiment in which it is possible to use prior knowledge for an optimal variation of the sequence control parameter is an implementation of a contiguous sequence of individual measurements to create an enrichment curve as it has already been mentioned above. Such magnetic resonance measurement sequences deal with detecting the enrichment and/or depletion of a specific contrast agent in a specific organ or tissue region and generating a progression curve from this. According to a preferred variant of the method according to the invention, as a sequence control parameter of the measurement time interval the measurement time interval between two successive measurements can thereby be varied depending on a slope of the time curve of the enrichment that is to be expected. This means that the chronological order of the individual acquisitions is not constant—as has previously been the case—but rather changes in a manner such that the chronological change between the measurements is detected particularly well. For example, measurements always take place in a more frequent chronological sequence when the difference is presumably greatest, and measurement takes place with a greater time interval at the beginning and end of the enrichment time.

It is thereby possible to temporally shift other measurements (that should also still be implemented within a magnetic resonance examination) between the individual measurements of the measurement sequence to acquire the enrichment curve in order save measurement time overall.

DESCRIPTION OF THE PREFERRED EMBODIMENTS

Figure 1:
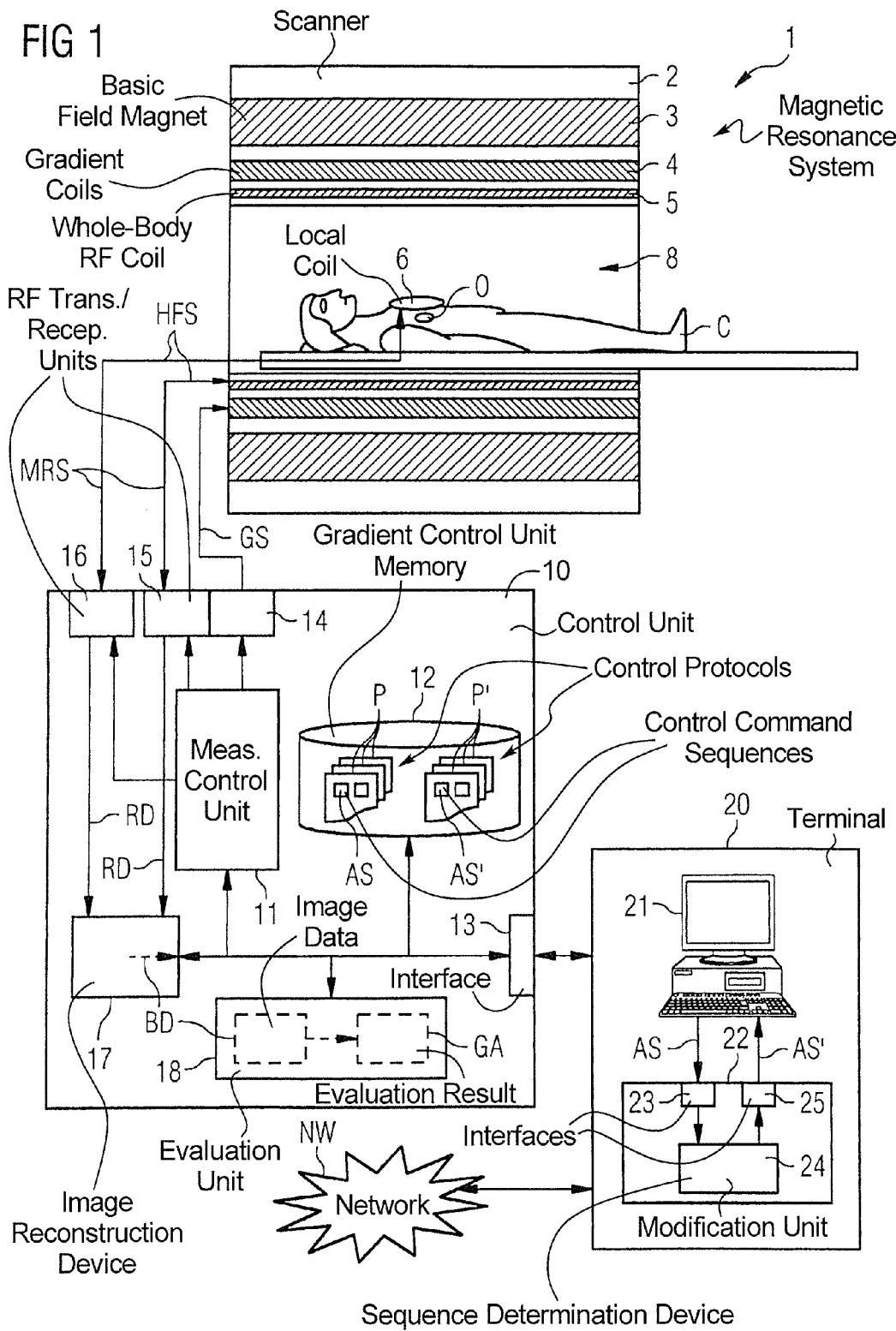
FIG. 1 schematically illustrates an exemplary embodiment of magnetic resonance system according to the present invention.

A magnetic resonance system 1 according to the invention is schematically roughly depicted in FIG. 1. The system 1 includes the actual magnetic resonance scanner 2 with an examination space 8 or patient tunnel located therein. A bed 7 can be driven into this examination space 8 so that, during an examination, a patient C or test subject who is lying on the bed 7 can be borne at a defined position within the magnetic resonance scanner 2 relative to the magnet system and radio-frequency system arranged therein so that the patient C or test subject can also be moved between various positions during a measurement. Here a specific organ—the heart, for example—of the patient C is schematically shown as a possible examination subject O.

Significant components of the magnetic resonance scanner 2 are a basic field magnet 3; magnetic field gradient coils 4 in order to apply arbitrary magnetic field gradients in the x-, y- and z-direction; and a whole body radio-frequency coil 5. The acquisition of magnetic resonance signals induced in the examination subject O can take place via the whole body RF coil 5 with which the radio-frequency signals to induce the magnetic resonance signals are normally emitted. However, these signals are typically received with local coils 6 placed on or below the patient C (advantageously close to the examination subject O). All of these components are fundamentally known to the man skilled in the art and are therefore only roughly schematically depicted in FIG. 1.

The various components of the scanner can be controlled via a control device 10. This can be a control computer which can also include a number of individual computers, possibly even individual computers that are spatially separated and connected among one another by suitable cables or the like.

This control device 10 is connected via a terminal interface 13 with a terminal 20 via which an operator can control the entire system 1. In the present case, this terminal 20—as a computer—is equipped with a keyboard, one or more monitors 21 and additional input devices (for example mouse or the like) so that a graphical user interface is provided to the operator.

Among other things, the control device 10 has a gradient control unit 14 that can in turn comprise multiple sub-components. The individual gradient coils 4 are supplied with gradient control signals GS via this gradient control unit 14. These are gradient pulses that are set at precisely provided time positions and with a precisely predetermined time curve during a measurement. The gradient control unit 14, together with the gradient coils 4, forms a gradient system.

The control device 10 moreover has radio-frequency transmission/reception units 15, 16, and in fact a radio-frequency transmission/reception unit 15 for the whole-body coil 5 and a radio-frequency transmission/reception unit 16 for local coils 6.

These RF transmission/reception units 15, 16 likewise comprise multiple sub-components. A transmission part of the transmission/reception units 15, 16 respectively ensures that suitable radio-frequency signals RFS are emitted to excite the nuclear spins in the desired volume. Magnetic resonance signals MRS can be received by the coils 5, 6 by means of a reception part of the RF transmission/reception units 15, 16. At least the reception typically takes place with the aid of the local coils 6. The RF transmission/reception units 15, 16 together with the coils 5, 6 form the radio-frequency transmission/reception system.

The RF transmission/reception units 15, 16 and the gradient control unit 14 are controlled in coordination via a measurement control unit 11. With suitable commands, this ensures that a desired gradient pulse train is emitted and controls the respective RF transmission/reception unit 15, 16 in parallel so that a matching RF pulse train is emitted. Moreover, it must be ensured that, at the matching point in time, the magnetic resonance signals MRS are read out at the whole-body coil 5 and/or at the local coils 6 via the associated RF transmission/reception unit 15, 16 and are processed further. The measurement control unit 11 provides the corresponding control commands according to a predetermined control protocol P, P'. All control data that must be set during a measurement are stored in this control protocol P, P'.

A number of control protocols P, P' for different measurements are typically stored in a memory 12. These could be selected by the operator via the terminal 20 and varied as necessary in order to then provide a matching control protocol P, P' for the currently selected measurement with which the measurement control unit 11 can operate. Moreover, the operator can also retrieve control protocols (for example from a manufacturer of the magnetic resonance system) via a network NW and then modify and use these as necessary.

The received magnetic resonance signals MRS are passed as raw data RD (in digitized, prepared form) by the RF transmission/reception units 15, 16 to a reconstruction unit 17 that reconstructs the image data BD from these, and stores these image data BD in a memory 12 and/or passes them via the interface 12 to the terminal 20 so that the operator can view them. The image data BD can also be stored at other locations via a network NW and/or be displayed and evaluated.

Moreover, the control device 10 here includes an evaluation unit 18 which is in the position to implement evaluations of the image data BD (generated by the reconstruction device 17) of the different individual measurements of a measurement sequence, and from these to form an overall evaluation result GA. For example, the individual slice images of an organ can be automatically evaluated by this evaluation unit 18 to the effect of how large the intersection of this organ in the slice images is. The intersection is then multiplied with a defined volume (for example the slice interval between the individual slice images) and then the total volume of the organ to be examined is determined from this. For example, the evaluation unit 18 can be implemented in the form of software on a processor within the control device 10. In principle, however, it is also possible to only implement such evaluations later, outside of the actual control device 10, for example within a computer of the terminal 20 or at another computer which has received the measurement results of the individual measurements (the individual slice images, for example) via the network NW.

However, the basic workflow of such a magnetic resonance measurement and the cited components for control are known to those skilled in the art, such that they are not addressed further in detail here. Moreover, such a magnetic resonance scanner 2 as well as the associated control device 10 can still have a number of additional components that here are likewise not explained in detail. At this point it is noted that the magnetic resonance scanner 2 can also be of different design, for example with a laterally open patient space.

Moreover, a control sequence determination device 22 according to the invention that serves to determine a control command sequence AS, AS' is schematically shown in FIG. 1. Organized in a matching order, this control command sequence AS, AS' includes the control commands for the respective pulses to be emitted, as well as the associated commands to read out the magnetic resonance signals in order to have a sequence of individual measurements of a magnetic resonance measurement to be implemented run automatically in succession. This control command sequence AS, AS' is created as part of the measurement protocol P, P' in the present case.

Here the control sequence determination device 22 is presented as part of the terminal 20 and can be realized in the form of software components at the computer of this terminal 20. In principle, however, the control sequence determination device 22 can also be part of the control device 10 itself or can be realized at a separate computer system, and the finished control command sequences AS, AS' can be transmitted (possibly also within the framework of a complete control protocol P, P') via a network NW to the magnetic resonance system 1.

Here the control sequence determination device 22 is shown simplified as a type of control sequence modification device which is in the position to adopt a finished control command sequence AS (which belongs to a specific protocol P) via an input interface 23 in order to then modify this in the manner according to the invention in a modification unit 24 and then output it again as a modified control command sequence AS' via an output interface 25, and to store said modified control command sequence AS' again in a protocol P or, respectively, a protocol P modified in this manner (which protocol P or, respectively, P' is in a memory 12), or to use said modified control command sequence AS' for an immediate activation of the scanner 2 to implement a desired magnetic resonance measurement. The modification of the magnetic resonance system control command sequence AS takes place in the manner according to the invention so that a defined (previously typically constant) sequence control parameter is varied according to a predetermined rule between the different individual measurements, such that the variance of a measurement error is minimized with regard to the overall evaluation result which should ultimately result from the magnetic resonance measurement sequence. One possible rule for modification of a sequence control parameter within the scope of a multislice measurement is explained at FIGS. 2 and 3 in the following.

Figure 2:
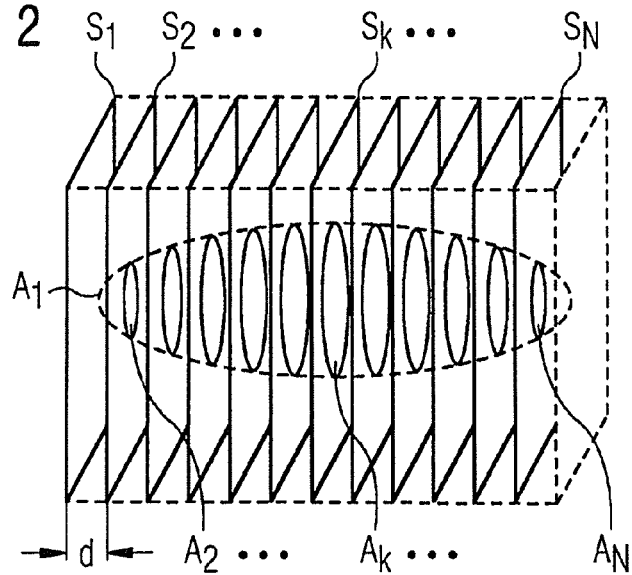
FIG. 2 schematically illustrates a multi-slice measurement (data acquisition) according to a conventional procedure with a constant slice interval.

For this purpose, an examination subject O is schematically presented (in the form of a dashed line) in FIG. 2. Here the shape of an ellipsoid has been selected in order to depict in a simple example that the examination subject O (a heart chamber, for example) typically does not have a constant diameter such as a cylinder, but rather is blunted at the ends or possibly even tapers to a point.

Within the scope of a multislice measurement, multiple slices images of this examination subject O are then acquired in parallel slices $S_1, S_2, \ldots, S_k, \ldots, S_N$, wherein the slice thickness d—which here corresponds to the interval between the slices $S_1, S_2, \ldots, S_k, \ldots, S_N$—is constant for the entire multislice measurement. A typical, concrete exemplary embodiment of this relates to the volumetric measurement of the blood volume in the heart of a patient. Such measurements are typically evaluated via equidistant multislice measurements, planimetering of the individual section slices, and adding up the individual cross section areas of the examination subject, multiplied with the slice thickness. This means that the volume V results according to $$V = d \cdot \sum_k A_k \qquad (1)$$

from the constant slice thickness d and the cross section areas $A_k$ of the k=1, ..., N measurements. This summation of the volume V from the individual volumes of the slice images basically corresponds to a numerical integration of the volume, wherein the relative positions (predetermined by the slice thickness D or, respectively, the slice interval) form N nodes at which the individual slices $S_1, S_2, \ldots, S_k, \ldots, S_N$ are measured.

As FIG. 2 shows, the volume acquired in the individual slices $S_1, S_2, \ldots, S_k, \ldots, S_N$—i.e. the cross section area A of the examination subject O—is different. The cross section area $A_k$ decreases toward the ends or tips of the examination subject O, in contrast to which the cross section area $A_k$ is relatively large in the middle.

Figure 3:
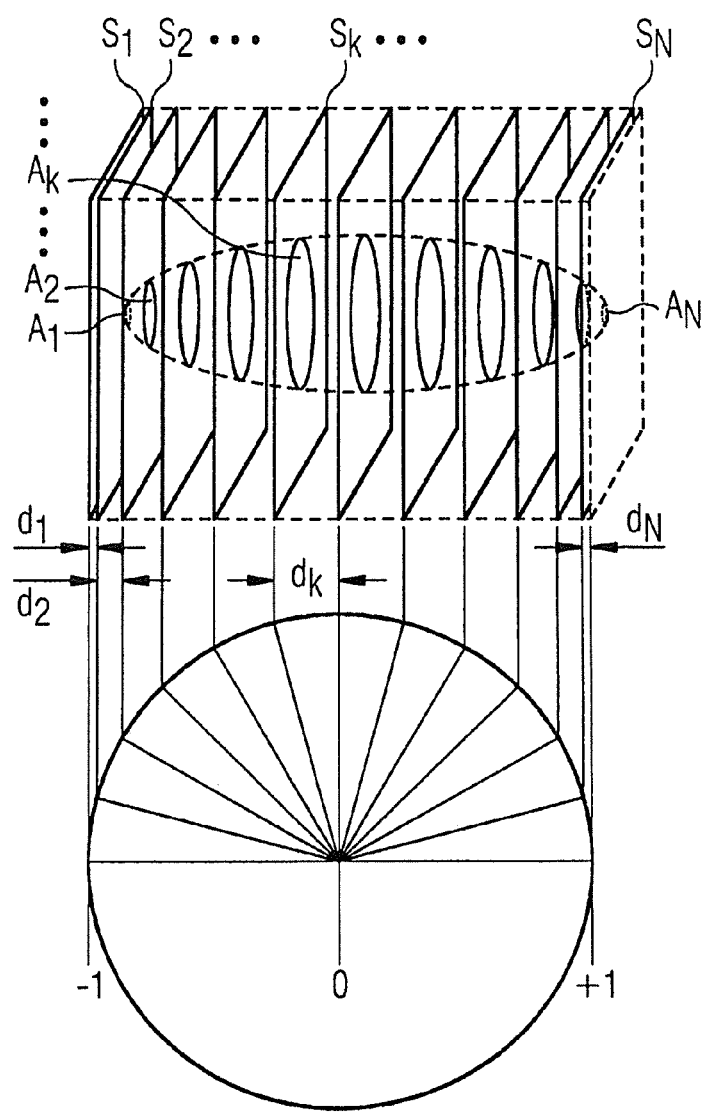
FIG. 3 schematically illustrates a multi-slice measurement (data acquisition) according to an embodiment of the method of the invention, in which a rule for variation of the slice interval is also schematically illustrated.

Since the total volume V of the examination subject O that is determined in this way is multiplied, proportional to the thickness d of the individual slices, with the sum of the cross section areas $A_k$, the measurement error of the overall evaluation result (i.e. the measurement error in the total volume) can be reduced if the slice thickness d is not kept constant as in FIG. 2 but rather—as is schematically shown in FIG. 3—is varied from individual measurement to individual measurement within the multislice measurement. According to this method, the volume V of the examination subject O thus results according to $$V = \sum_k d_k \cdot A_k. \qquad (2)$$

$d_k$ is the respective, individual slice thickness selected according to the variation rule in the k=1, ..., N measurements.

FIG. 3 shows a variation rule suitable for this in which the procedure of a Gaussian integration is used. The individual measurement positions (i.e. the N nodes for the integration of the volume) are now established depending on the cross section area $A_k$ to be expected in the respective slice plane. More nodes are thereby set at important points (in this case at the terminating edges of the examination subject), and fewer nodes are set in the regions at which the cross section area of the organ to be examined changes less.

Different mathematical methods can be resorted to in order to find an automatic establishment of the slice thicknesses or, respectively, slice intervals. For example, as shown in FIG. 3 the slice intervals can be selected so that, if the positions of the individual slice images would be projected on a circular orbit, these projections lie at a constant angular separation relative to one another. This means that the interval $d_k$ of the k-th slice $S_k$ is determined according to $$d_k = \cos\frac{k\pi}{N} - \cos\frac{(k-1)\pi}{N} \qquad (3)$$

Since the measurement error is naturally accordingly greater in the slice planes in which the cross section area $A_k$ is smaller than in the slice planes in which the cross section area $A_k$ is larger, via the variation of the slice thickness $d_k$ according to the invention it is ensured that each slice now supplies the same error contributions since the individual cross section areas $A_k$ are also weighted differently in this way. Overall, the variance of the measurement error is thus minimized so that the measurement error of the overall evaluation result (i.e. of the sought volume V) is consequently reduced.

In a similar manner, through simple variation of specific sequence control parameters it can also be achieved that different overall evaluation results are affected by a smaller measurement error.

Figure 4:
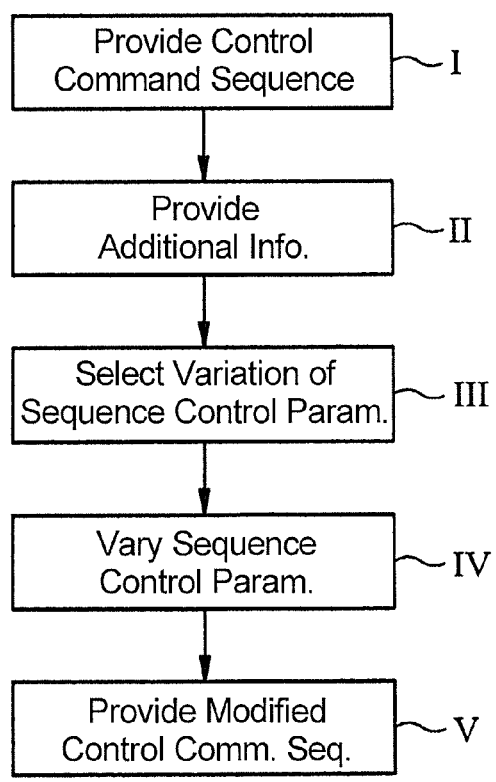
FIG. 4 is a flowchart of an exemplary embodiment of the method according to the invention.

In a schematic workflow, FIG. 4 again shows a possible mode of operation of a control sequence determination device according to the invention as it is shown in FIG. 1.

The method initially begins in Step I so that a conventional control command sequence AS is provided, for example a control sequence which predetermines constant slice intervals and slice thicknesses of a multislice measurement for volume determination of an examination subject as this has previously been explained using FIG. 2.

In Step II additional information (for example a specific geometry of the examination subject or information about a measurement error distribution that is to be expected, for example whether the measurement errors are equally distributed or are geometry-dependent) is provided the control sequence determination device 22 via the input interface 23, for example.

Depending on the existing prior knowledge, one or more rules for automatic variation of the sequence control parameters can then be selected in Step III. For example, here it can be established that a variation should take place according to a Gaussian integration.

In Step IV the relevant sequence control parameters are subsequently varied according to the predetermined rules so that then the modified magnetic resonance control command sequence AS' can finally be output in Step V.

It is clear that this modification of an already existing control command sequence AS or, respectively, an existing measurement protocol P is only one possibility to implement the invention. In principle, it is also possible that already existing control sequence determination devices are modified so that a magnetic resonance system control command sequence with already correspondingly varied sequence control parameters is already generated from the outset depending on the diagnostic question or, respectively, planned examination for which the measurement protocol is created.

The invention has been described in examples of a medical usage, but it is not limited to use for medical purposes; rather, it can also be used for other examinations, for example material tests.

Although modifications and changes may be suggested by those skilled in the art, it is the intention of the inventor to embody within the patent warranted heron all changes and modifications as reasonably and properly come within the scope of his contribution to the art.

I claim:

1. A method to automatically generate a control command sequence for operating a magnetic resonance data acquisition unit, comprising:
    in a processor, generating a magnetic resonance data acquisition sequence for operating a magnetic resonance apparatus to acquire magnetic resonance data from an examination subject in a plurality of individual data acquisitions in a form allowing subsequent automated evaluation of the individual data acquisitions with respect to an evaluation parameter and to combine respective evaluation results from the individual data acquisitions into an overall evaluation result of the magnetic resonance data acquisition sequence;
    designing said control command sequence to operate said magnetic resonance data acquisition unit to cause at least one sequence control parameter to be varied between different individual data acquisitions in a manner that causes a variance of a measurement error in said overall evaluation result to be minimized; and
    making said control command sequence available at an output of said processor in electronic form as signals for operating said magnetic resonance data acquisition unit.

2. A method as claimed in claim 1 comprising varying, as said at least one sequence control parameter, a resolution with which said magnetic resonance data are acquired in respective individual data acquisitions.

3. A method as claimed in claim 1 comprising, in each of said plurality of individual data acquisitions, entering data acquired therein into a memory representing k-space having a matrix size and a number of lines into which data are entered, and varying, as said at least one sequence parameter, said matrix size and said number of lines into which data are entered.

4. A method as claimed in claim 1 comprising designing said control command sequence as a multi-slice sequence in which magnetic resonance data are acquired from respectively different slices of the examination subject in said plurality of individual data acquisitions, and varying, as said sequence control parameter, a slice thickness of the respective slices, a slice interval between respective slices, and a slice orientation of the respective slices.

5. A method as claimed in claim 1 wherein each of said plurality of individual data acquisitions has a data acquisition time duration associated therewith, and vary, as said at least one sequence control parameter, said data acquisition time duration.

6. A method as claimed in claim 1 comprising varying said at least one sequence control parameter dependent on an expected data acquisition error distribution of the respective individual data acquisitions.

7. A method as claimed in claim 1 comprising varying said at least one sequence control parameter according to a Gaussian integration rule.

8. A method as claimed in claim 1 comprising varying said at least one sequence control parameter based on prior knowledge of the examination subject.

9. A method as claimed in claim 8 comprising varying said at least one sequence control parameter dependent on prior knowledge of the examination subject obtained from a medical image of the examination subject acquired prior to operating said magnetic resonance data acquisition unit with said control command sequence.

10. A method as claimed in claim 1 comprising varying said at least one sequence control parameter dependent on a geometric parameter of the examination subject that is relevant for said plurality of individual data acquisitions.

11. A method as claimed in claim 10 comprising designing said control command sequence to implement a multi-slice magnetic resonance sequence wherein magnetic resonance data are acquired from respective, different slices of the examination subject respectively in said plurality of individual data acquisitions and varying, as said at least one sequence control parameter, at least one of a slice interval and a slice thickness of the respective slice acquired in each individual data acquisition, dependent on a cross-sectional area of the examination subject in the respective slice, as said geometric parameter.

12. A method as claimed in claim 11 comprising varying said slice interval as said at least one sequence control parameter, by shortening said slice interval as changes in said cross-sectional area more significantly increase between adjacent respective slices.

13. A method as claimed in claim 11 comprising varying said slice thickness as said at least one sequence control parameter, by lengthening said slice thickness as changes in said cross-sectional area more significantly increase between adjacent respective slices.

14. A method as claimed in claim 1 comprising designing said control command sequence and, in said processor, evaluating the plurality of individual data acquisitions with regard to said evaluation parameter, to produce an enrichment curve, and varying respective data acquisition time durations of the respective individual data acquisitions, as said at least one sequence control parameter, dependent on an expected slope with respect to time of said enrichment as represented in said enrichment curve.

15. A control sequence determination device to automatically generate a control command sequence for operating a magnetic resonance data acquisition unit, comprising:
    a processor having an input that receives a magnetic resonance data acquisition sequence for operating a magnetic resonance apparatus to acquire magnetic resonance data from an examination subject in a plurality of individual data acquisitions in a form allowing subsequent automated evaluation of the individual data acquisitions with respect to an evaluation parameter and to combine respective evaluation results from the individual data acquisitions into an overall evaluation result of the magnetic resonance data acquisition sequence;
    said processor being configured to automatically modify said control command sequence to operate said magnetic resonance data acquisition unit to cause at least one sequence control parameter to be varied between different individual data acquisitions in a manner that causes a variance of a measurement error in said overall evaluation result to be minimized; and
    said processor having an output at which said control command sequence is available at an output of said processor in electronic form as signals for operating said magnetic resonance data acquisition unit.

16. A magnetic resonance system comprising:
    a magnetic resonance data acquisition unit configured to receive an examination subject therein, said magnetic resonance data acquisition unit comprising a radio-frequency transmission/reception system, a gradient system, and a control device configured to operate the radio-frequency transmission/reception system and the gradient system dependent on a control command sequence supplied thereto; and a control sequence determination device in communication with said control device, said control sequence determination device comprising a processor having an input that receives a magnetic resonance data acquisition sequence for operating the magnetic resonance data acquisition unit to acquire magnetic resonance data from an examination subject in a plurality of individual data acquisitions in a form allowing subsequent automated evaluation of the individual data acquisitions with respect to an evaluation parameter and to combine respective evaluation results from the individual data acquisitions into an overall evaluation result of the magnetic resonance data acquisition sequence, said processor being configured to automatically modify said control command sequence to operate said magnetic resonance data acquisition unit to cause at least one sequence control parameter to be varied between different individual data acquisitions in a manner that causes a variance of a measurement error in said overall evaluation result to be minimized, and having an output at which said control command sequence is supplied in electronic form as signals to said control unit for operating said magnetic resonance data acquisition unit.

17. A non-transitory, computer-readable data storage medium encoded with programming instructions, said storage medium being loadable into a computerized control sequence determination device and said programming instructions causing said control sequence determination device to:

generate a magnetic resonance data acquisition sequence for operating a magnetic resonance apparatus to acquire magnetic resonance data from an examination subject in a plurality of individual data acquisitions in a form allowing subsequent automated evaluation of the individual data acquisitions with respect to an evaluation parameter and to combine respective evaluation results from the individual data acquisitions into an overall evaluation result of the magnetic resonance data acquisition sequence;

design said control command sequence to operate said magnetic resonance data acquisition unit to cause at least one sequence control parameter to be varied between different individual data acquisitions in a manner that causes a variance of a measurement error in said overall evaluation result to be minimized; and make said control command sequence available at an output of said processor in electronic form as signals for operating said magnetic resonance data acquisition unit.

* * * * *